US012652005B2

(12) United States Patent
Stanic et al.

(10) Patent No.: US 12,652,005 B2
(45) Date of Patent: Jun. 9, 2026

(54) AMPLIFIER WITH IMPROVED POWER SUPPLY REJECTION IN FEEDBACK CIRCUITS

(71) Applicant: pSemi Corporation, San Diego, CA (US)

(72) Inventors: Nebojsa Stanic, Austin, TX (US); Xiaoling Guo, Austin, TX (US); Sivakumar Ganesan, Austin, TX (US); James Francis McElwee, Austin, TX (US)

(73) Assignee: PSEMI CORPORATION, San Diego, CA (US)

( * ) Notice: Subject to any disclaimer, the term of this patent is extended or adjusted under 35 U.S.C. 154(b) by 704 days.

(21) Appl. No.: 18/071,136

(22) Filed: Nov. 29, 2022

(65) Prior Publication Data

US 2024/0178798 A1 May 30, 2024

(51) Int. Cl.
H03F 1/26 (2006.01)
H03F 1/32 (2006.01)
(Continued)

(52) U.S. Cl.
CPC ............. H03F 1/3205 (2013.01); H03F 1/26 (2013.01); H03F 1/56 (2013.01); H03F 3/195 (2013.01);
(Continued)

(58) Field of Classification Search
CPC . H03F 1/3205; H03F 1/26; H03F 1/56; H03F 1/565; H03F 1/223; H03F 3/195;
(Continued)

(56) References Cited

U.S. PATENT DOCUMENTS 7,949,322 B2 * 5/2011 Kim .................... H03F 3/45188
455/248.1
7,956,682 B2 6/2011 Hasegawa
(Continued)

FOREIGN PATENT DOCUMENTS

KR 10-2018-0132927 12/2018
KR 10-2019-0127078 11/2019

OTHER PUBLICATIONS

Cadence: PCB Design and Analysis "Cascode Amplifier Configuration: Advantages and Disadvantages" (Year: 2025).*
(Continued)

*Primary Examiner* — Andrea Lindgren Baltzell
*Assistant Examiner* — Nareh Shamiryan
(74) *Attorney, Agent, or Firm* — Steinfl + Bruno LLP

(57) ABSTRACT

Frequency-selective feedback circuits and methods for an amplifier (particularly LNAs) that improve power supply rejection in feedback circuits, reduce non-linearities caused by low-frequency noise coupled to the input of the LNA, and improve settling times of the quiescent bias-point of the LNA. Some embodiments allow multiple modes of operation to allow selection of gain versus linearity characteristics. One aspect of the present invention includes an input matching feedback circuit configured to be coupled between an input terminal of an amplification core and a feedback node in the output signal path of the amplification core, the input matching feedback circuit including a power supply rejection resistor configured to provide a low-impedance path to a reference potential for low-frequency noise.

20 Claims, 9 Drawing Sheets

(51) Int. Cl.
    *H03F 1/56*           (2006.01)
    *H03F 3/195*         (2006.01)

(52) U.S. Cl.
    CPC .. *H03F 2200/222* (2013.01); *H03F 2200/451*
                                    (2013.01)

(58) Field of Classification Search
    CPC ............... H03F 3/193; H03F 2200/451; H03F
                                              2200/222
    USPC ................. 330/277, 311, 296, 285, 282–283
    See application file for complete search history.

(56)               References Cited

U.S. PATENT DOCUMENTS

| | | | |
|---|---|---|---|
| 10,615,756 B2 | 4/2020 | Pehlivanoglu | |
| 10,826,442 B2 * | 11/2020 | Yoo ....................... | H03G 1/0029 |
| 11,038,465 B2 * | 6/2021 | Hageraats ............. | H03F 1/0205 |

| | | | |
|---|---|---|---|
| 2007/0024377 A1 * | 2/2007 | Wang ........................ | H03F 1/42 |
| | | | 330/305 |
| 2015/0381123 A1 * | 12/2015 | Wu .......................... | H03F 1/342 |
| | | | 330/282 |
| 2019/0007003 A1 * | 1/2019 | Sivonen .................. | H03F 3/195 |
| 2022/0216833 A1 | 7/2022 | Jiang et al. | |
| 2022/0321074 A1 * | 10/2022 | Lehtola .................... | H03F 3/19 |
| 2022/0393650 A1 | 12/2022 | Ayranci et al. | |
| 2024/0030875 A1 * | 1/2024 | Mohammadnezhad ..................... | |
| | | | H03F 1/3205 |

OTHER PUBLICATIONS

Tutorialspoint "Electronic Circuits—Diode as a Switch" (Year: 2025).*
Lee, Kang Ha, International Search Report and Written Opinion received from the KIPO dated Mar. 26, 2024 for appln No. PCT/US2023/081412, 11 pgs.

\* cited by examiner

_800_

AMPLIFIER WITH IMPROVED POWER SUPPLY REJECTION IN FEEDBACK CIRCUITS

BACKGROUND

(1) Technical Field

The invention relates to electronic circuits, and more particularly to radio frequency amplifier circuits.

(2) Background

Many modern electronic systems include radio frequency (RF) receivers; examples include cellular telephones, personal computers, tablet computers, wireless network components, televisions, cable system "set top" boxes, and radar systems. Many RF receivers are paired with RF transmitters in the form of transceivers, which often are quite complex two-way radios. In some cases, RF transceivers are capable of transmitting and receiving across multiple frequencies in multiple bands.

Amplifiers are a common component in RF transmitters, receivers, and transceivers, and are frequently used for power amplification of transmitted RF signals and for low-noise amplification of received RF signals. For many RF systems, particularly those requiring low power and/or portability (e.g., cellular telephones, WiFi-connected computers, cameras, and other devices), it has become common to use complementary metal-oxide semiconductor (CMOS) fabrication technology to create low cost, low power integrated circuits (ICs). CMOS devices include bulk CMOS, silicon-on-insulator (SOI) CMOS, and silicon-on-sapphire (SOS) CMOS (SOS being a type of SOI fabrication technology).

FIG. 1 is a simplified schematic diagram of a generalized embodiment of a prior art low-noise amplifier (LNA) circuit 100. In the illustrated example, the LNA circuit 100 includes an amplifier block 102 comprising a stack of two FETs $M_{CS}$, $M_{CG}$ series-connected through their respective conduction channels (between drain and source) in a cascode arrangement. An RF input signal applied to an RF input terminal $RF_{IN}$ may be passed through an input impedance matching circuit 104 and coupled to the gate of the common-source lower FET $M_{CS}$. The source of lower FET $M_{CS}$ is often connected through a degeneration inductor $L_{DEG}$ to a reference potential, such as circuit ground.

In the illustrated example, the source of the common-gate upper FET $M_{CG}$ is connected to the drain of lower FET $M_{CS}$. The drain of upper FET $M_{CG}$ provides an amplified RF output signal through a DC blocking capacitor C to an RF output terminal $RF_{OUT}$. Capacitor C may also aid in providing output impedance matching. A bias-isolating inductor L is connected between a source voltage $V_{DD}$ and the drain of upper FET $M_{CG}$ to aid in providing output impedance matching and to provide a bias feed to the amplifier block 102. In the illustrated example, the RF output terminal $RF_{OUT}$ is shown coupled to a typical load, represented as a resistor $R_L$. The value of $R_L$ is typically 50 ohms for many modern RF circuits.

A bias circuit 106 is configured to provide a suitable bias voltage $CG\_V_{BIAS}$ to the common-gate upper FET $M_{CG}$ and a suitable bias voltage $CS\_V_{BIAS}$ to the common-source lower FET $M_{CS}$. Additional circuit elements that might be included in some applications, such as bypass capacitors and more sophisticated impedance matching circuitry, are omitted for clarity.

Important desired characteristics of an LNA are high gain with low noise, a wide bandwidth, good linearity, and good output impedance matching. Accordingly, four important design parameters for LNAs are gain, noise figure (NF), input-referenced third intercept point (IIP3), and output reflection coefficient. NF is a measure of degradation of the signal-to-noise ratio (SNR) caused by components in a signal chain, with lower values indicating better performance. IIP3 is a figure of merit representing amplifier linearity, with higher values indicating better performance. In general, NF has a stricter specification requirement in high-gain modes than in low gain-modes, while IIP3 usually has a higher specification requirement in low-gain modes than in high-gain modes. The output reflection coefficient is the $S_{22}$ scattering parameter (or "S-parameter") and is an indication of output impedance matching, with lower (more negative, when evaluated logarithmically) numbers indicating better impedance matching.

Increases in the frequency of RF communications bands and channels, as well as a continuing increase in the number of bands and channels in use, has pushed current LNA architectures to their limits. For example, achieving stringent requirements for gain, percentage bandwidth, linearity, and output impedance matching with a traditional LNA architecture like the circuit shown in FIG. 1 is not possible for some of the new 5G mobile network bands, particularly in the 3 to 6 GHz NR bands, the upcoming 7-24 GHz bands, and the millimeter wave range (e.g., 24.25 GHz to 52.6 GHz).

Accordingly, there is a need for an LNA architecture that overcomes the limitations of conventional LNA architectures.

SUMMARY

The present invention encompasses frequency-selective circuits and methods for an amplifier (particularly LNAs) that achieve improved power supply rejection in feedback circuits, reduce non-linearities caused by low-frequency noise coupled to the input of the LNA, and improve settling times of the quiescent bias-point of the LNA. Some embodiments allow multiple modes of operation to allow selection of gain versus linearity characteristics. The inventive circuits and methods may also be applied to other types of amplifiers, such as power amplifiers.

One aspect of the present invention includes an input matching feedback circuit configured to be coupled between an input terminal of an amplification core and a feedback node in the output signal path of the amplification core, the input matching feedback circuit including: a first capacitor; a variable resistor coupled in series with the first capacitor; a switch coupled in series with the variable resistor; a second capacitor coupled in series with the switch; and a power supply rejection resistor coupled to a node located between the first capacitor and the variable resistor and configured to be coupled to a reference potential.

Another aspect of the present invention includes a method of improving power supply rejection in frequency-selective feedback for a radio frequency amplifier having an amplification core, the method including: coupling an input matching feedback circuit between an input terminal of the amplification core and a feedback node in the output signal path of the amplification core; and providing, within the input matching feedback circuit, a low-impedance signal path to a reference potential for low-frequency noise.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements unless the context requires otherwise.

DETAILED DESCRIPTION

The present invention encompasses frequency-selective circuits and methods for an amplifier (particularly LNAs) that improve power supply rejection in feedback circuit, reduce non-linearities caused by low-frequency noise coupled to the input of the LNA, and improve settling times of the quiescent bias-point of the LNA. Some embodiments allow multiple modes of operation to allow selection of gain versus linearity characteristics. The inventive circuits and methods may also be applied to other types of amplifiers, such as power amplifiers.

Improved LNA Embodiment

Figure 2:
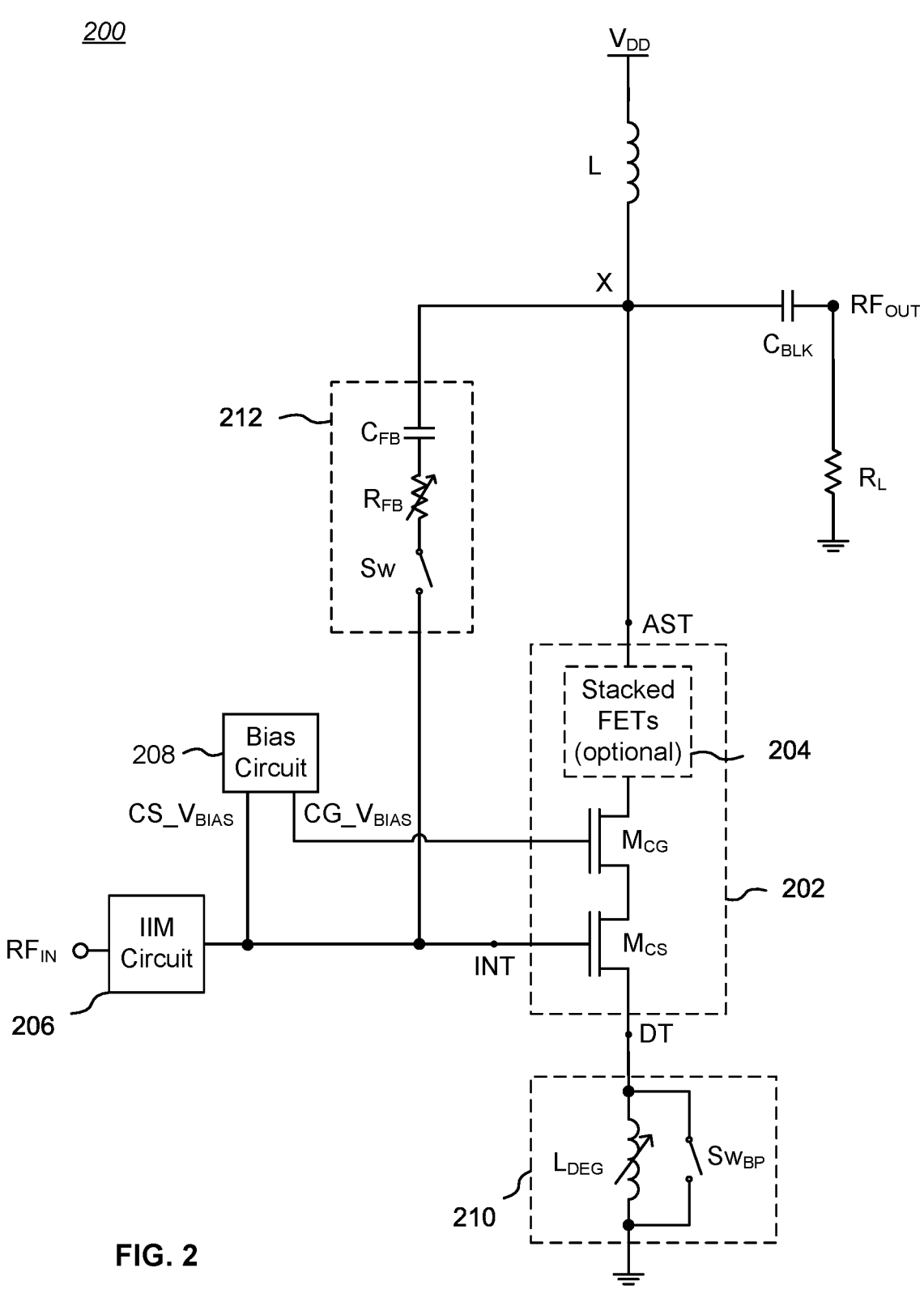
FIG. 2 is a simplified schematic diagram of an embodiment of an improved performance LNA circuit.

FIG. 2 is a simplified schematic diagram of an embodiment of an improved performance LNA circuit 200. The LNA circuit 200 includes an amplification core 202 that includes a common-source FET $M_{CS}$ and a common-gate FET $M_{CG}$ series-connected through their respective conduction channels (between drain and source) in a cascode arrangement. The gate of the common-source FET $M_{CS}$ may be regarded as an input terminal INT of the amplification core 202, the source of the common-source FET $M_{CS}$ may be regarded as a degeneration terminal DT of the amplification core 202, and the drain of the common-gate FET $M_{CG}$ may be regarded as an amplified-signal terminal AST of the amplification core 202. In some embodiments, in order to overcome a relatively low breakdown voltage per CMOS FET, multiple common-gate FETS may be series-coupled through their respective conduction channels in a FET stack 204 between the drain of the bottom-most common-gate FET $M_{CG}$ and the amplified-signal terminal AST—that is, the amplification core 202 may have multiple series-coupled common-gate FETs in a cascode configuration. The amplified-signal terminal AST would then be the drain of the upper-most common-gate FET in the amplification core 202.

An RF input signal applied to an RF input terminal $RF_{IN}$ may be passed through an input impedance matching circuit 206 and coupled to the input terminal INT of the amplification core 202. A bias circuit 208 is configured to provide a suitable bias voltage $CG\_V_{BIAS}$ to the common-gate FET $M_{CG}$ and a suitable bias voltage $CS\_V_{BIAS}$ to the common-source FET $M_{CS}$. The bias circuit 208 or a separate bias source (not shown) may provide a suitable bias voltage or voltages to the constituent FETs within the FET stack 204.

The amplified-signal terminal AST provides an amplified RF output signal through a DC blocking capacitor CBLK to an RF output terminal $RF_{OUT}$. Capacitor CBLK may also aid in providing output impedance matching. A bias-isolating inductor L is connected between a source voltage $V_{DD}$ and the amplified-signal terminal AST to aid in providing output impedance matching and to provide a bias feed to the amplifier block 202. In the illustrated example, the RF output terminal $RF_{OUT}$ is shown coupled to a typical load, represented as a resistor $R_L$. The value of $R_L$ is typically 50 ohms for many modern RF circuits.

The degeneration terminal DT is typically coupled through a degeneration circuit 210 to a reference potential, such as circuit ground. In some embodiments, the degeneration circuit 210 may comprise an adjustable degeneration inductor $L_{DE}G$, such as a multiport integrated circuit inductor coil. An adjustable degeneration inductor $L_{DEG}$ may be used to improve linearity in low gain modes. For example, a smaller value for the degeneration inductor $L_{DEG}$ may be used in a higher-gain modes, and a larger value for the degeneration inductor $L_{DEG}$ may be used in a lower-gain modes. Some embodiments of the degeneration circuit 210 may include a bypass switch $Sw_{BP}$ coupled in parallel with the degeneration inductor $L_{DE}G$.

The illustrated embodiment includes an input matching feedback circuit 212. The input matching feedback circuit 212 is shown coupled between the input terminal INT and the amplified-signal terminal AST of the amplifier block 202. More generally, the input matching feedback circuit 212 may be coupled to a feedback node in the output signal path of the amplification core 202, which may be the drain of any of the FETS in the amplification core 202. The choice of feedback node for connection to the input matching feedback circuit 212 may be made, for example, based on desired feedback strength and/or input impedance.

The input matching feedback circuit 212 in the illustrated embodiment comprises a DC-blocking/AC-coupling capacitor $C_{FB}$ series-coupled to a variable resistor $R_{FB}$, which in turn is series-coupled to a switch Sw. The capacitor $CF_B$, the resistor $R_{FB}$, and the switch Sw may be connected in any series order in alternative embodiments, although a specific order may be preferred in some applications from a biasing perspective and/or to reduce the impact of related parasitics. In some embodiments, the capacitor $C_{FB}$ may be adjustable. The input matching feedback circuit 212 may be disabled by opening switch Sw and enabled by closing switch Sw. In alternative embodiments, the switch Sw may be omitted, thereby permanently coupling the input matching feedback circuit 212 between the input terminal INT and a feedback node in the output signal path of the amplification core 202.

The resistance value of the variable resistor $R_{FB}$ allows the Q-factor of the input impedance matching to be adjusted, which allows variation in the bandwidth of the enhanced LNA circuit 200 (with trade-offs with respect to gain and NF). Thus, an advantage of using a variable or multi-state input matching feedback circuit 212 is that multiple resistance values enable multiple gain modes. For instance, LNAs in mobile RF receiver devices need multiple gain modes depending upon the range of input signal strength at the receiver. In addition, enabling multiple gain modes by varying the resistance value of resistor $R_{FB}$ may eliminate the need for an output attenuator (common in conventional receiver LNAs).

Figure 3:
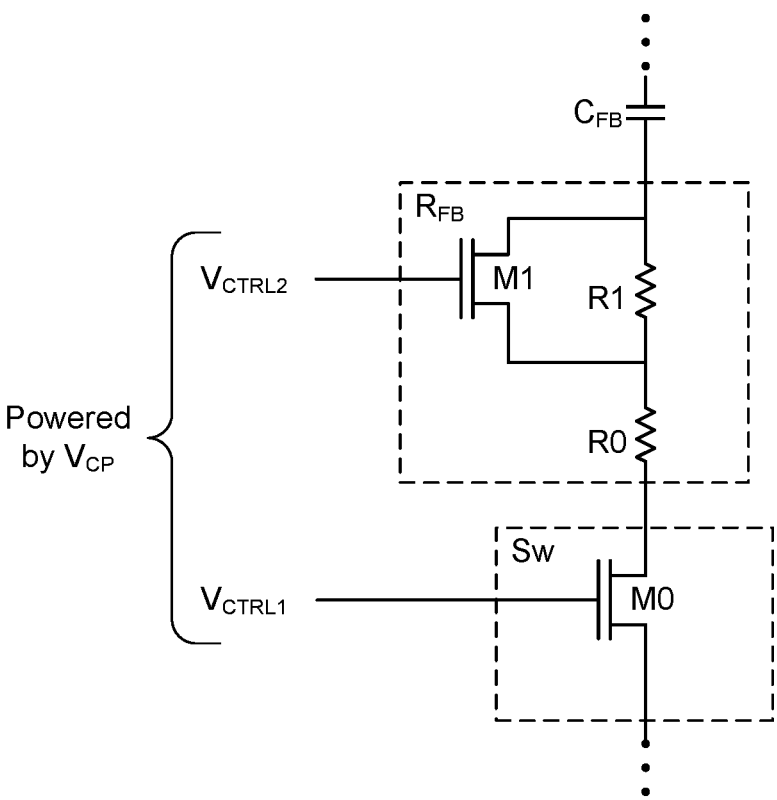
FIG. 3 is a simplified schematic diagram of a more detailed embodiment of the input matching feedback circuit of FIG. 2.

FIG. 3 is a simplified schematic diagram of a more detailed embodiment of the input matching feedback circuit 212 of FIG. 2. The switch Sw is depicted as a FET M0 having its gate coupled to a control signal $V_{CTRL1}$. The variable resistor $R_{FB}$ may be implemented as a first resistor R0 coupled in series with a second resistor R1. A FET M1 is coupled in parallel with the second resistor R1 and has its gate coupled to a control signal $V_{CTRL2}$. Accordingly, when the control signal $V_{CTRL2}$ sets M1 to an OFF (non-conducting) state, the resistance of the variable resistor $R_{FB}$ is R0+R1. Conversely, when the control signal $V_{CTRL2}$ sets M1 to an ON (conducting) state, the resistance of the variable resistor $R_{FB}$ is about R0 (neglecting the ON resistance $R_{ON}$ of M1). As should be clear, the variable resistor $R_{FB}$ may be implemented in a number of ways that allow for selection of more than two resistance values. For example, adding another separately controlled bypassable resistor in series with resistors R0 and R1 allows for selection of four resistance values. As another example, one or more bypassable resistors may be coupled in parallel with resistor R0 and/or resistor R1.

Further information regarding the input matching feedback circuit 212 may be found in U.S. patent application Ser. No. 17/337,227, filed Jun. 2, 2021, entitled "*Wideband Multi Gain LNA Architecture*", assigned to the assignee of the present invention, the contents of which are hereby incorporated by reference.

Improved LNA Embodiment with Power Supply Rejection in Feedback

Figure 1:
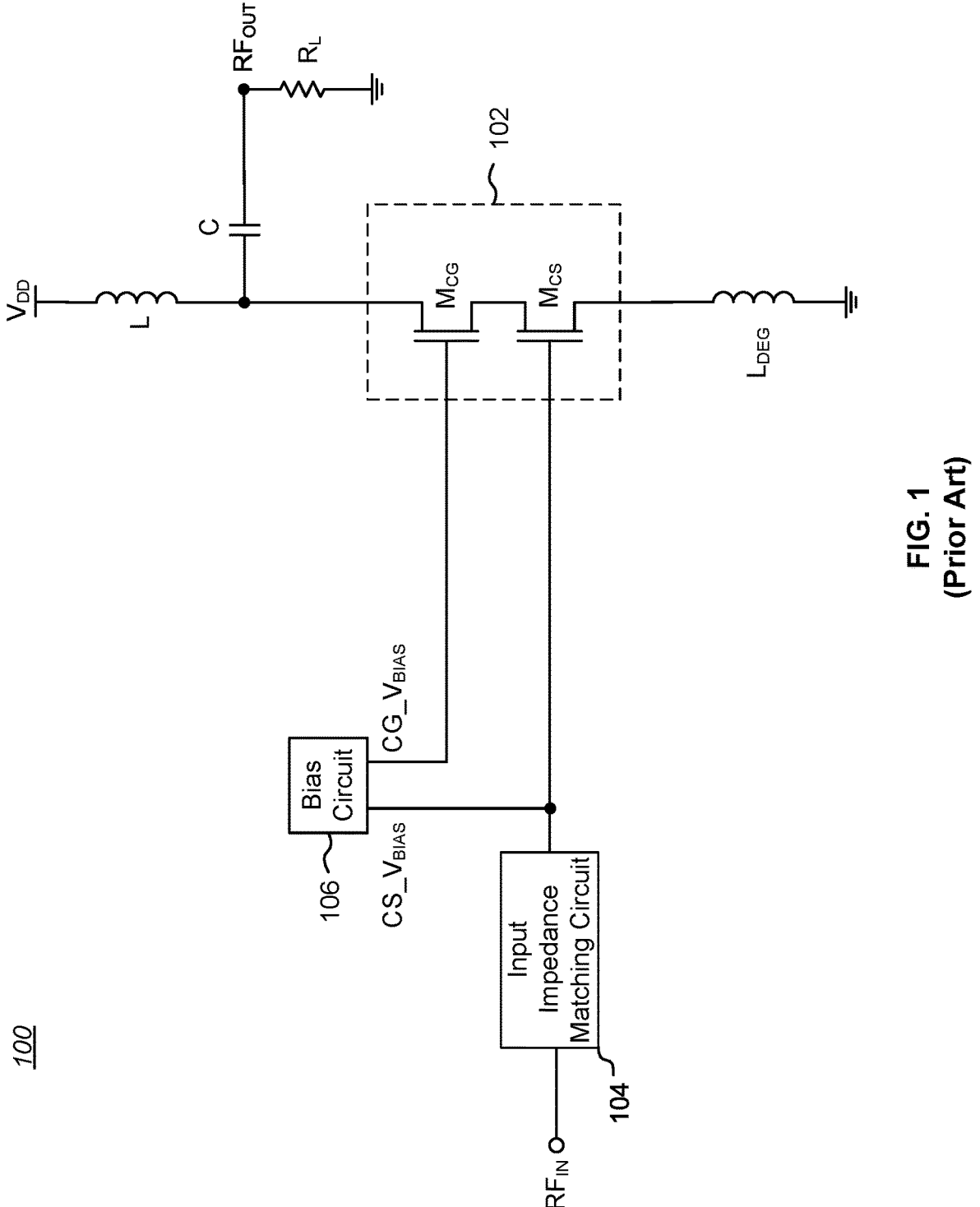
FIG. 1 is a simplified schematic diagram of a generalized embodiment of a prior art low-noise amplifier (LNA) circuit.

The LNA circuit 200 of FIG. 2 exhibits improved performance compared to the circuit 100 of FIG. 1. However, performance can be further improved to mitigate an issue that may arise when using an input matching feedback circuit 212. In particular, an LNA having an input matching feedback circuit 212 may suffer from poor rejection of low-frequency noise generated by internal and/or external voltage supplies. For example, such voltage supplies may include the source voltage $V_{DD}$ and an internal charge pump generating a voltage $V_{CP}$ used to power the control signals (e.g., $V_{CTRL1}$ and $V_{CTRL2}$ in FIG. 3) for a variable resistor $R_FB$. Such noise may be sufficiently low in frequency (e.g., less than 100 MHz, and particularly less than 10 MHz) that noise signal leakage to the input of the LNA circuit 200 may occur through, for example, noise filtering capacitors.

The input of an LNA is particularly sensitive to such low-frequency noise. For example, low-frequency noise coupled to the input terminal INT of the amplification core 202 may be upconverted through a non-linearity of an LNA to RF frequencies and may cause a reduction of the Signal-to-Noise Ratio (SNR) at the output of the LNA. As another example, low-frequency noise coupled to the input terminal INT of the amplification core 202 may cause slow settling times of the quiescent bias-point of the LNA during LNA turn-ON and LNA turn-OFF, or other quiescent bias-point changing events.

Figure 4A:
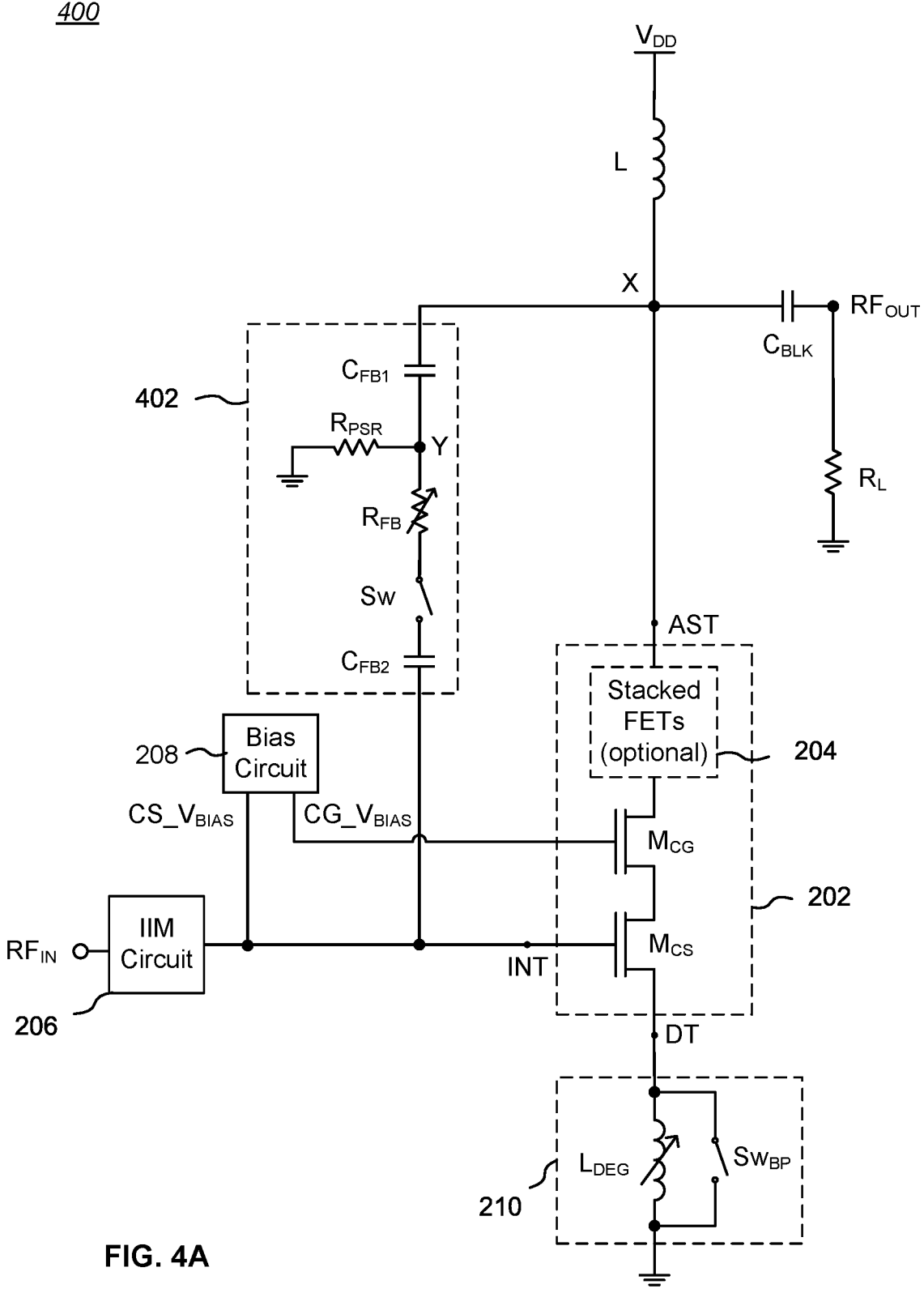
FIG. 4A is a simplified schematic diagram of an embodiment of an improved performance LNA circuit in accordance with the present invention.

One aspect of the present invention is a modified input matching feedback circuit that improves Power Supply Rejection (PSR) while maintaining RF performance. FIG. 4A is a simplified schematic diagram of an embodiment of an improved performance LNA circuit 400 in accordance with the present invention. Similar in most aspects to the LNA 200 in FIG. 2, the LNA circuit 400 replaces the input matching feedback circuit 212 of FIG. 2 with an improved input matching feedback circuit 402.

The improved input matching feedback circuit 402 is shown coupled between the input terminal INT and the amplified-signal terminal AST of the amplifier block 202. More generally, the improved input matching feedback circuit 402 may be coupled to a feedback node in the output signal path of the amplification core 202, which may be the drain of any of the FETS in the amplification core 202. The choice of feedback node for connection to the improved input matching feedback circuit 402 may be made, for example, based on desired feedback strength and/or input impedance.

The improved input matching feedback circuit 402 in the illustrated embodiment comprises a DC-blocking/AC-coupling first capacitor $C_{FB1}$ series-coupled to a variable resistor $R_{FB}$. The variable resistor $R_{FB}$ in turn is series-coupled to a switch Sw, which in turn is series-coupled to a DC-blocking/AC-coupling second capacitor $C_{FB2}$. The first capacitor $C_{FB1}$, the variable resistor $R_{FB}$, the switch Sw, and the second capacitor $C_{FB2}$ define a feedback signal path through the improved input matching feedback circuit 402.

A PSR resistor $R_{PSR}$ is coupled between the feedback signal path of the improved input matching feedback circuit 402 and a reference potential, which may be circuit ground. For example, FIG. 4A shows the PSR resistor $R_{PSR}$ as being coupled to the feedback signal path between (1) a node Y, located between the first capacitor $C_{FB1}$ and the variable resistor $R_{FB}$, and (2) the reference potential. It has been found that the illustrated location for connecting the PSR resistor $R_{PSR}$ to the feedback signal path provides good amplifier performance. However, the PSR resistor $R_{PSR}$ may be coupled to other locations along the feedback signal path, such as between the variable resistor $R_{FB}$ and switch Sw, or between switch Sw and the second capacitor $C_{FB2}$.

In some embodiments, the first and/or second capacitors $C_{FB1}$, $C_{FB2}$ may be adjustable. The improved input matching feedback circuit 402 may be placed in a disabled state by opening switch Sw and placed in an enabled state by closing switch Sw. In alternative embodiments, the switch Sw may be omitted, thereby permanently coupling the improved input matching feedback circuit 402 between the input terminal INT and a feedback node in the output signal path of the amplification core 202.

The PSR resistor $R_{PSR}$ provides a low-impedance signal path to the reference potential for low-frequency noise from voltage supplies (e.g., $V_{CP}$ and $V_{DD}$) that might otherwise be coupled through the feedback signal path to the input terminal INT of the amplification core 202. For example, the control signals ($V_{CTRL1}$, $V_{CTRL2}$) for the variable resistor $R_{FB}$ may cause low-frequency noise from the $V_{CP}$ voltage supply to be coupled to the input terminal INT. The PSR resistor $R_{PSR}$ may be designed to not load the feedback signal path and the output of the LNA circuit 400 to maintain RF performance. For example, the PSR resistor $R_{PSR}$ may have a resistance value in the range of about 1 KΩ to about 100 KΩ.

In a preferred embodiment, the series-coupled first and second capacitors $C_{FB1}$, $C_{FB2}$ each have about twice the capacitance value of the capacitor $C_{FB}$ of the LNA 200 of FIG. 2; that is, $C_{FB1}=C_{FB2}=2\times C_{FB}$, resulting in an equivalent capacitance of just $C_{FB}$. For example, $C_{FB}$ may be in the range of about 0.1 pF to about 10 pF; thus, $C_{FB1}$ and $C_{FB2}$ would preferably have twice the capacitance value selected from that range, and thus be in the range of about 0.2 pF to about 20 pF. However, in some embodiments, the values of the first and second capacitors $C_{FB1}$, $C_{FB2}$ may be other than $2\times C_{FB}$.

The splitting of the AC-coupling capacitor in the feedback signal path of the improved input matching feedback circuit 402 compared to the LNA 200 of FIG. 2 can also improve filtering of any low-frequency voltage supply noise coupled to the feedback signal path, such as through the control signals (e.g., $V_{CTRL1}$ and $V_{CTRL2}$) for the variable resistor $R_{FB}$. The second capacitor $C_{FB2}$ coupled closest to the RF input terminal $RF_{IN}$ should be sized so as to present a high impedance at low frequencies compared to the impedance of the PSR resistor $R_{PSR}$ so as to direct low frequency noise to the reference potential through the PSR resistor $R_{PSR}$.

The improved input matching feedback circuit 402 may be used in other LNA and amplifier topologies, and is not limited to the topology of the improved performance LNA circuit 400 of FIG. 4A.

Figure 4B:
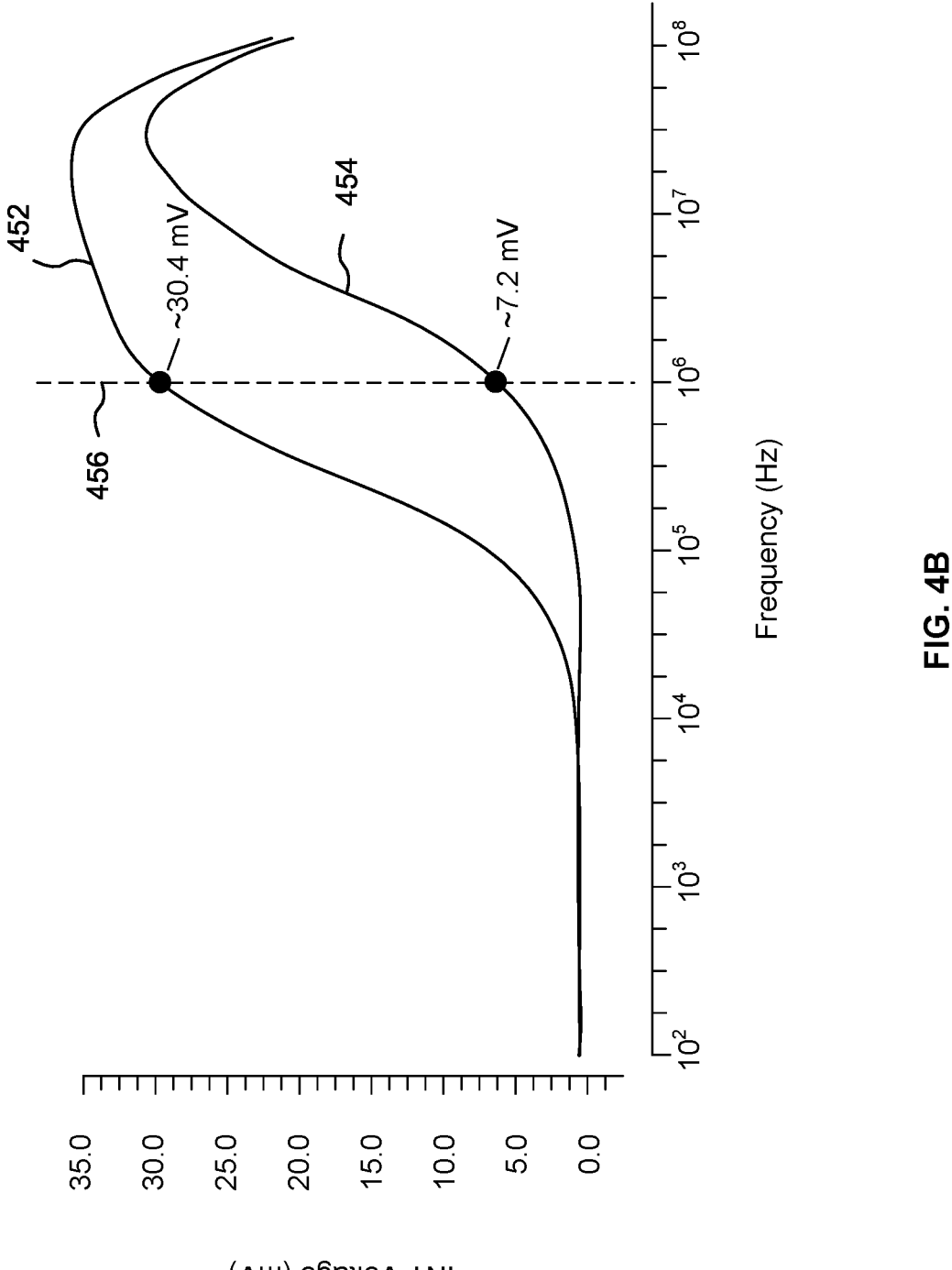
FIG. 4B is a graph of voltage as a function of frequency for modeled embodiments of the LNA circuit of FIG. 2 and the improved performance LNA circuit of FIG. 4A.

FIG. 4B is a graph 450 of voltage as a function of frequency for modeled embodiments of the LNA circuit 200 of FIG. 2 and the improved performance LNA circuit 400 of FIG. 4A. The voltage is measured at the input terminal INT of the amplification core 202 when a 100 mV AC signal is applied at $V_{DD}$. Graph line 452 represents the response of the LNA circuit 200 of FIG. 2, and graph line 454 represents the response of the LNA circuit 400 of FIG. 4A. Dashed marker line 456 shows the corresponding voltages at a frequency of about 1 MHz—the LNA circuit 200 experiences a feedback leakage voltage of about 30.4 mV, while the LNA circuit 400 experiences a feedback leakage voltage of only about 7.2 mV, a factor of 4 improvement. As the graph 450 shows, at all frequencies, the improved performance LNA circuit 400 exhibits lower leakage voltage to the input terminal INT of the amplification core 202 compared to the LNA circuit 200 of FIG. 2.

Circuit Embodiments

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit components or blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

Figure 5:
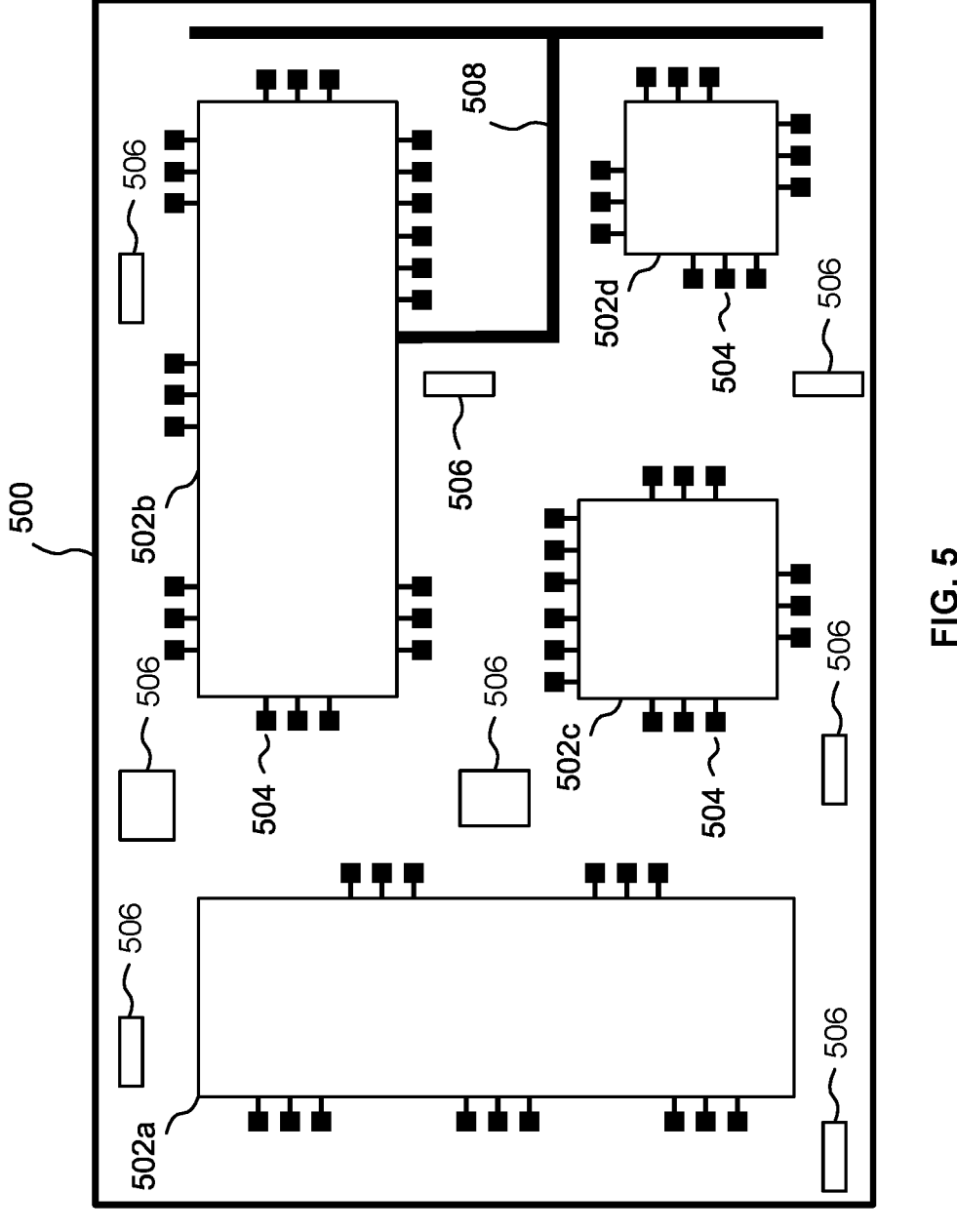
FIG. 5 is a top plan view of a substrate that may be, for example, a printed circuit board or chip module substrate (e.g., a thin-film tile).

As one example of further integration of embodiments of the present invention with other components, FIG. 5 is a top plan view of a substrate 500 that may be, for example, a printed circuit board or chip module substrate (e.g., a thin-film tile). In the illustrated example, the substrate 500 includes multiple ICs 502a-502d having terminal pads 504 which would be interconnected by conductive vias and/or traces on and/or within the substrate 500 or on the opposite (back) surface of the substrate 500 (to avoid clutter, the surface conductive traces are not shown and not all terminal pads are labelled). The ICs 502a-502d may embody, for example, signal switches, active or passive filters, amplifiers (including one or more LNAs), and other circuitry. For example, IC 502b may incorporate one or more instances of an LNA circuit like the circuits 400 shown in FIG. 4A.

The substrate 500 may also include one or more passive devices 506 embedded in, formed on, and/or affixed to the substrate 500. While shown as generic rectangles, the passive devices 506 may be, for example, filters, capacitors, inductors, transmission lines, resistors, planar antennae elements, transducers (including, for example, MEMS-based transducers, such as accelerometers, gyroscopes, microphones, pressure sensors, etc.), batteries, etc., interconnected by conductive traces on or in the substrate 500 to other passive devices 506 and/or the individual ICs 502a-502d.

The front or back surface of the substrate 500 may be used as a location for the formation of other structures. For example, one or more antennae may be formed on or affixed to the front or back surface of the substrate 500; one example of a front-surface antenna 508 is shown, coupled to an IC die 502b, which may include RF front-end circuitry. Thus, by including one or more antennae on the substrate 500, a complete radio may be created.

System Aspects

Embodiments of the present invention are useful in a wide variety of larger radio frequency (RF) circuits and systems, such as radio systems (particularly including cellular radio systems), personal computers, tablet computers, wireless network components, televisions, cable system "set top" boxes, radar systems (including phased array and automotive radar systems), and test equipment.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G New Radio, and WiFi (e.g., 802.11a, b, g, ac, ax, be), as well as other radio communication standards and protocols.

Figure 6:
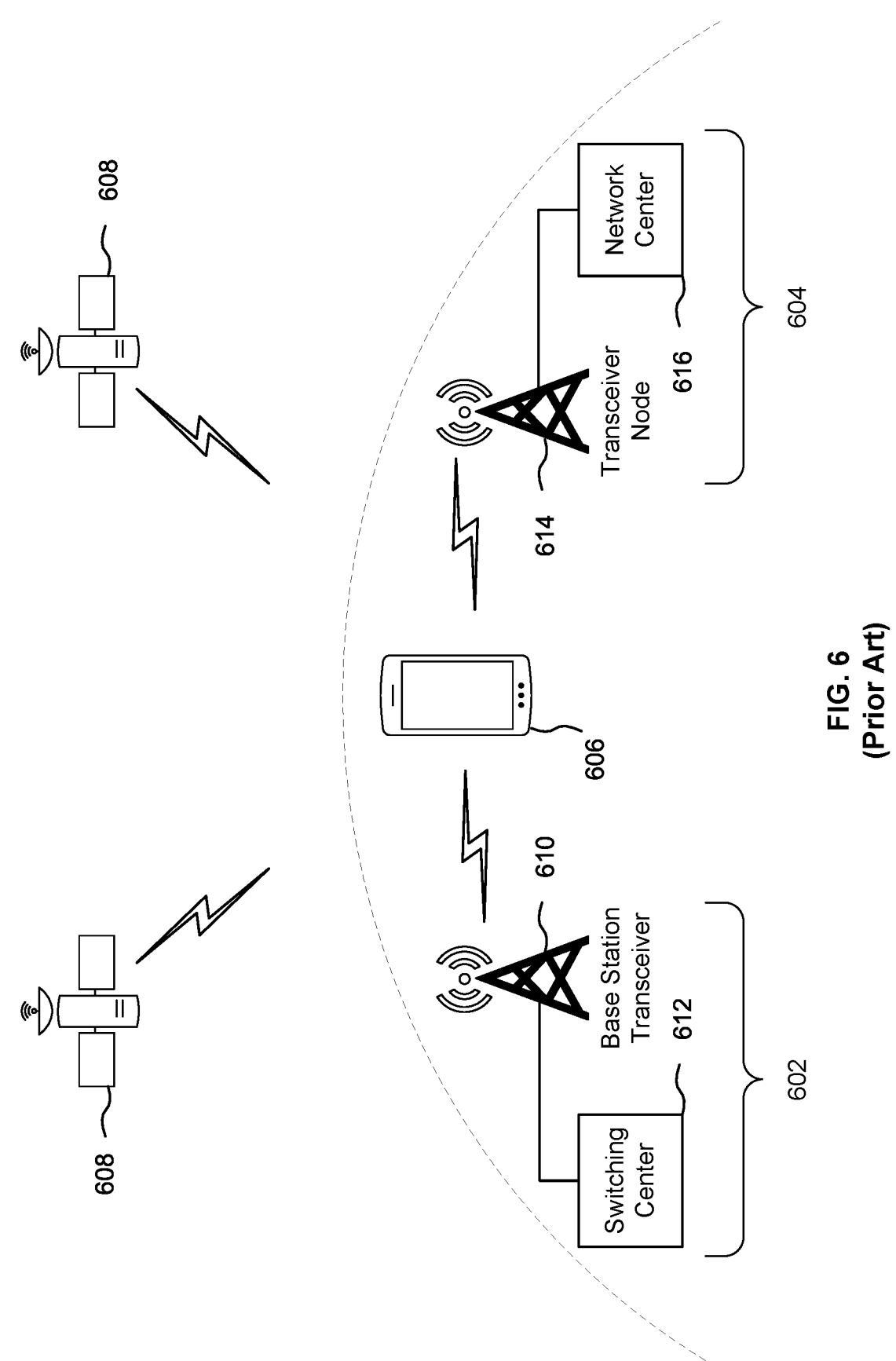
FIG. 6 illustrates an exemplary prior art wireless communication environment comprising different wireless communication systems, and may include one or more mobile wireless devices.

As an example of wireless RF system usage, FIG. 6 illustrates an exemplary prior art wireless communication environment 600 comprising different wireless communication systems 602 and 604, and may include one or more mobile wireless devices 606.

A wireless device 606 may be capable of communicating with multiple wireless communication systems 602, 604 using one or more of the telecommunication protocols noted above. A wireless device 606 also may be capable of communicating with one or more satellites 608, such as navigation satellites (e.g., GPS) and/or telecommunication satellites. The wireless device 606 may be equipped with multiple antennas, externally and/or internally, for operation on different frequencies and/or to provide diversity against deleterious path effects such as fading and multi-path interference. A wireless device 606 may be a cellular phone, a personal digital assistant (PDA), a wireless-enabled computer or tablet, or some other wireless communication unit or device. A wireless device 606 may also be referred to as a mobile station, user equipment, an access terminal, or some other terminology.

The wireless system 602 may be, for example, a CDMA-based system that includes one or more base station trans-ceivers (BSTs) 610 and at least one switching center (SC) 612. Each BST 610 provides over-the-air RF communica-tion for wireless devices 606 within its coverage area. The SC 612 couples to one or more BSTs in the wireless system 602 and provides coordination and control for those BSTs.

The wireless system 604 may be, for example, a TDMA-based system that includes one or more transceiver nodes 614 and a network center (NC) 616. Each transceiver node 614 provides over-the-air RF communication for wireless devices 606 within its coverage area. The NC 616 couples to one or more transceiver nodes 614 in the wireless system 604 and provides coordination and control for those trans-ceiver nodes 614.

In general, each BST 610 and transceiver node 614 is a fixed station that provides communication coverage for wireless devices 606, and may also be referred to as base stations or some other terminology. The SC 612 and the NC 616 are network entities that provide coordination and control for the base stations and may also be referred to by other terminologies.

Figure 7:
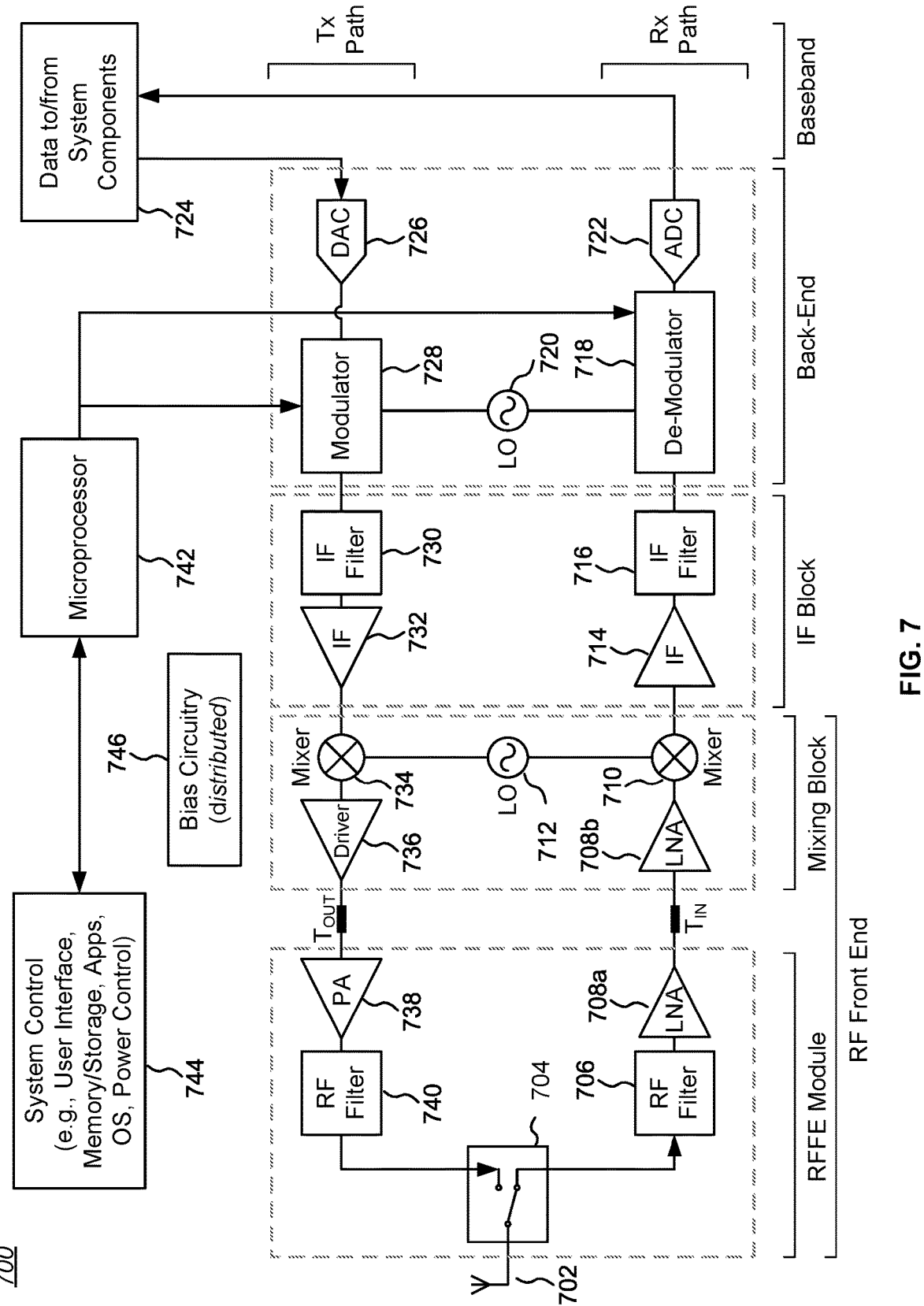
FIG. 7 is a block diagram of a transceiver that might be used in a wireless device, such as a cellular telephone, and which may beneficially incorporate an embodiment of the present invention for improved performance.

An important aspect of any wireless system is in the details of how the component elements of the system perform. FIG. 7 is a block diagram of a transceiver 700 that might be used in a wireless device, such as a cellular telephone, and which may beneficially incorporate an embodiment of the present invention for improved perfor-mance. As illustrated, the transceiver 700 includes a mix of RF analog circuitry for directly conveying and/or transform-ing signals on an RF signal path, non-RF analog circuitry for operational needs outside of the RF signal path (e.g., for bias voltages and switching signals), and digital circuitry for control and user interface requirements. In this example, a receiver path Rx includes RF Front End, Intermediate Fre-quency (IF) Block, Back-End, and Baseband sections (not-ing that in some implementations, the differentiation between sections may be different). The various illustrated sections and circuit elements may be embodied in one die or multiple IC dies. For example, the RF Front End in the illustrated example may include an RFFE module and a Mixing Block, which may be embodied in (or as part of) different IC dies or modules. The different dies and/or modules may be coupled by transmission lines $T_{IN}$ and $T_{OUT}$ (e.g., microstrips, co-planar waveguides, or an equivalent structure or circuit), either or both of which may have, for example, a 50Q impedance.

The receiver path Rx receives over-the-air RF signals through at least one antenna 702 and a switching unit 704, which may be implemented with active switching devices (e.g., field effect transistors or FETs) and/or with passive devices that implement frequency-domain multiplexing, such as a diplexer or duplexer. An RF filter 706 passes desired received RF signals to at least one low noise amplifier (LNA) 708*a*, the output of which is coupled from the RFFE Module to at least one LNA 708*b* in the Mixing Block (through transmission line $T_{IN}$ in this example). The LNA(s) 708*b* may provide buffering, input matching, and reverse isolation. The LNAs 708*a*, 708*b* may be instances of the LNA 400 shown in FIG. 4A above.

The output of the LNA(s) 708*b* is combined in a corre-sponding mixer 710 with the output of a first local oscillator 712 to produce an IF signal. The IF signal may be amplified by an IF amplifier 714 and subjected to an IF filter 716 before being applied to a demodulator 718, which may be coupled to a second local oscillator 720. The demodulated output of the demodulator 718 is transformed to a digital signal by an analog-to-digital converter 722 and provided to one or more system components 724 (e.g., a video graphics circuit, a sound circuit, memory devices, etc.). The con-verted digital signal may represent, for example, video or still images, sounds, or symbols, such as text or other characters.

In the illustrated example, a transmitter path Tx includes Baseband, Back-End, IF Block, and RF Front End sections (again, in some implementations, the differentiation between sections may be different). Digital data from one or more system components 724 is transformed to an analog signal by a digital-to-analog converter 726, the output of which is applied to a modulator 728, which also may be coupled to the second local oscillator 720. The modulated output of the modulator 728 may be subjected to an IF filter 730 before being amplified by an IF amplifier 732. The output of the IF amplifier 732 is then combined in a mixer 734 with the output of the first local oscillator 77 to produce an RF signal. The RF signal may be amplified by a driver 736, the output of which is coupled to a power amplifier (PA) 738 (through transmission line $T_{OUT}$ in this example). The amplified RF signal may be coupled to an RF filter 740, the output of which is coupled to at least one antenna 702 through the switching unit 704.

The operation of the transceiver 700 is controlled by a microprocessor 742 in known fashion, which interacts with system control components 744 (e.g., user interfaces, memory/stor-age devices, application programs, operating system software, power control, etc.). In addition, the trans-ceiver 700 will generally include other circuitry, such as bias circuitry 746 (which may be distributed throughout the transceiver 700 in proximity to transistor devices), electro-static dis-charge (ESD) protection circuits, testing circuits (not shown), factory programming interfaces (not shown), etc.

In modern transceivers, there are often more than one receiver path Rx and transmitter path Tx, for example, to accommodate multiple frequencies and/or signaling modali-ties. Further, as should be apparent to one of ordinary skill in the art, some components of the transceiver 700 may be positioned in a different order (e.g., filters) or omitted. Other components can be (and often are) added, such as (by way of example only) additional filters, impedance matching networks, variable phase shifters/attenuators, power divid-ers, etc.

As a person of ordinary skill in the art will understand, an RF system architecture is beneficially impacted by the current invention in critical ways, including reduction of non-linearities caused by low-frequency noise coupled to the input terminal INT of the amplification core 202 and improved settling times of the quiescent bias-point of the LNA circuit 400. These system-level improvements are specifically enabled by the current invention and enable embodiments of the invention to meet the strict performance specifications of customers and a number of RF standards. The current invention is therefore critical to embodiments of the overall system shown in FIG. 7.

Methods

Figure 8:
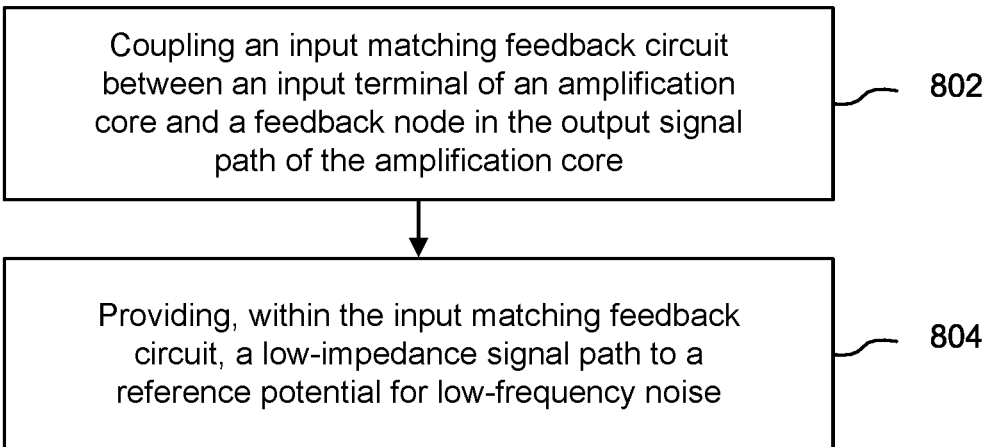
FIG. 8 is a process flow chart showing a first method of improving power supply rejection in frequency-selective feedback for a radio frequency amplifier having an amplification core.

FIG. 8 is a process flow chart 800 showing a first method of improving power supply rejection in frequency-selective feedback for a radio frequency amplifier having an ampli-fication core. The method includes: coupling an input match-ing feedback circuit between an input terminal of an ampli-fication core and a feedback node in the output signal path of the amplification core [Block 802]; and providing, within the input matching feedback circuit, a low-impedance signal path to a reference potential for low-frequency noise [Block 804]. The low-impedance signal path may comprise a power supply rejection resistor.

A second method of improving power supply rejection in frequency-selective feedback circuit for a radio frequency amplifier having an amplification core includes coupling an input matching feedback circuit between an input terminal of the amplification core and a feedback node in the output signal path of the amplification core, the input matching feedback circuit including: a first capacitor; a variable resistor coupled in series with the first capacitor; a switch coupled in series with the variable resistor; a second capacitor coupled in series with the switch; and a power supply rejection resistor coupled to a node located between the first capacitor and the variable resistor and configured to be coupled to a reference potential.

Additional aspects of the above method may include modifying the circuit components implementing the method as described above and shown in FIGS. 2 and 4.

Fabrication Technologies & Options

While the example embodiments shown in FIGS. 2 and 4 are LNAs, the inventive circuits and methods may also be applied to other types of amplifiers, such as power amplifiers.

Additional well-known circuit elements that might be included in some applications, such as DC block capacitors, additional impedance matching circuitry, and additional filters, are omitted for clarity. Note also that a circuit component that is characterized as "adjustable" may have its value selected from a number of possible component value settings and fixed during fabrication, when assembled in a circuit module, during factory testing, or in the field (e.g., by burning or "blowing" fusible links), or may have its value be dynamically varied, tuned, or programmatically set, such as in response to other circuitry (e.g., temperature compensation and/or power control circuitry) or in response to generated or received command signals.

The modes of operation of the inventive LNA circuits may be set by a control circuit (not shown) in known fashion. The control circuit may also connect to the components that are adjustable to select different component values (e.g., capacitance, resistance, inductance) for different gain states, for example, to help input and/or output impedance matching or vary gain versus linearity in some modes of operation.

The switches shown in embodiments of the present invention may be implemented as FETs, particularly MOSFETs. The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "lower", "upper", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS transistor devices, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. An input matching feedback circuit configured to be coupled between an input terminal of an amplification core and a feedback node in an output signal path of the amplification core, the input matching feedback circuit including:
(a) a feedback signal path including:
(1) a first capacitor;
(2) a variable resistor coupled in series with the first capacitor;
(3) a switch coupled in series with the variable resistor; and
(4) a second capacitor coupled in series with the switch; and
(b) a power supply rejection resistor coupled to a node on the feedback signal path and configured to be coupled to a reference potential;
wherein the input matching feedback circuit is selectively switchable between an enabled feedback state and a disabled state by the switch, and wherein during the disabled state, the switch is open and the power supply rejection resistor is disconnected from the input terminal.

2. The input matching feedback circuit of claim 1, wherein the variable resistor includes:
(a) a first resistor;
(b) a second resistor coupled in series with the first resistor; and
(c) a bypass switch coupled in parallel with the second resistor.

3. The input matching feedback circuit of claim 1, wherein at least one of the first and second capacitors is variable.

4. The input matching feedback circuit of claim 1, wherein the power supply rejection resistor has a resistance value in the range of about 1KΩ to about 100KΩ.

5. The input matching feedback circuit of claim 1, wherein the first and second capacitors each have a capacitance value in the range of about 0.2 pF to about 20 pF.

6. The input matching feedback circuit of claim 1, wherein at least one of the first and second capacitors is variable, and wherein the variable resistor includes:
(a) a first resistor;
(b) a second resistor coupled in series with the first resistor; and
(c) a bypass switch coupled in parallel with the second resistor.

7. The input matching feedback circuit of claim 1, wherein the amplification core is a low-noise amplification core.

8. The input matching feedback circuit of claim 1, wherein the power supply rejection resistor is coupled to the feedback signal path at a node between the first capacitor and the variable resistor.

9. An amplifier including:
(a) an amplification core including:
(1) an input terminal configured to receive a radio-frequency (RF) signal; and
(2) an amplified-signal terminal;
(b) an output terminal; and (c) an input matching feedback circuit coupled between the input terminal of the amplification core and a feedback node in an output signal path of the amplification core, the input matching feedback circuit including:
(1) a feedback signal path including:
(A) a first capacitor coupled to the feedback node;
(B) a variable resistor coupled in series with the first capacitor;
(C) a switch coupled in series with the variable resistor; and
(D) a second capacitor coupled in series with the switch and coupled to the input terminal; and
(2) a power supply rejection resistor coupled to a node on the feedback signal path and configured to be coupled to a reference potential;
wherein the input matching feedback circuit is selectively switchable between an enabled feedback state and a disabled state by the switch, and wherein during the disabled state, the switch is open and the power supply rejection resistor is disconnected from the input terminal.

10. The amplifier of claim 9, wherein the variable resistor includes:
(a) a first resistor;
(b) a second resistor coupled in series with the first resistor; and
(c) a bypass switch coupled in parallel with the second resistor.

11. The amplifier of claim 9, wherein at least one of the first and second capacitors is variable.

12. The amplifier of claim 9, wherein the power supply rejection resistor has a resistance value in the range of about 1KΩ to about 100KΩ.

13. The amplifier of claim 9, wherein the first and second capacitors each have a capacitance value in the range of about 0.2 pF to about 20 pF.

14. The amplifier of claim 9, wherein the power supply rejection resistor is coupled to the feedback signal path at a node between the first capacitor and the variable resistor.

15. The amplifier of claim 9, further including an input impedance matching circuit coupled to the input terminal and configured to receive the RF signal.

16. The amplifier of claim 9, wherein the amplification core includes a degeneration terminal, and further including a degeneration circuit coupled to the degeneration terminal and configured to be coupled to a reference potential, the degeneration circuit including a degeneration inductor.

17. The amplifier of claim 9, wherein the amplifier is a low-noise amplifier.

18. The amplifier of claim 9, wherein the amplification core further includes:
(a) a common-source FET having a gate coupled to the input terminal signal, a source, and a drain;
(b) a stack comprising at least one common-gate FET, each common-gate FET having a gate, a source, and a drain outputting an amplified version of the received RF signal, wherein the source of one of the at least one common-gate FET is coupled to the drain of the common-source FET, and wherein the drain of one of the at least one common-gate FET is coupled to the amplified-signal terminal of the amplification core.

19. A circuit configured to be coupled between an input terminal of an amplification core and a feedback node in an output signal path of the amplification core, the circuit including:

a feedback signal path including a first capacitor, a variable resistor coupled in series with the first capacitor, a switch coupled in series with the variable resistor, and a second capacitor coupled in series with the switch;

a power supply rejection resistor coupled to a node on the feedback signal path and configured to be coupled to a reference potential;

wherein the circuit is selectively switchable between an enabled feedback state and a disabled state by the switch, and wherein during the disabled state, the switch is open and the power supply rejection resistor is disconnected from the input terminal.

20. The circuit of claim 19, wherein the variable resistor includes: a first resistor, a second resistor coupled in series with the first resistor, and a bypass switch coupled in parallel with the second resistor.

\* \* \* \* \*